(12) United States Patent
Stapleton

(10) Patent No.: US 9,093,448 B2
(45) Date of Patent: Jul. 28, 2015

(54) METHODS FOR PROTECTING A DIE SURFACE WITH PHOTOCURABLE MATERIALS

(71) Applicant: LORD CORPORATION, Cary, NC (US)

(72) Inventor: Russell A. Stapleton, Spartanburg, SC (US)

(73) Assignee: LORD Corporation, Cary, NC (US)

( * ) Notice: Subject to any disclaimer, the term of this patent is extended or adjusted under 35 U.S.C. 154(b) by 0 days.

(21) Appl. No.: 14/035,209

(22) Filed: Sep. 24, 2013

(65) Prior Publication Data

US 2014/0024175 A1 Jan. 23, 2014

Related U.S. Application Data

(62) Division of application No. 13/130,775, filed as application No. PCT/US2009/065887 on Nov. 25, 2009, now Pat. No. 8,568,961.

(60) Provisional application No. 61/174,147, filed on Apr. 30, 2009, provisional application No. 61/117,707, filed on Nov. 25, 2008.

(51) Int. Cl.
| | |
|---|---|
| G03F 7/26 | (2006.01) |
| H01L 21/50 | (2006.01) |
| H01L 21/56 | (2006.01) |
| H01L 23/00 | (2006.01) |
| H01L 23/29 | (2006.01) |

(52) U.S. Cl.
CPC .............. H01L 21/50 (2013.01); H01L 21/563 (2013.01); H01L 24/11 (2013.01); *H01L 23/293* (2013.01)

(58) Field of Classification Search
USPC .......................................... 430/315, 319, 330
See application file for complete search history.

(56) References Cited

U.S. PATENT DOCUMENTS

| | | | |
|---|---|---|---|
| 3,801,880 A | 4/1974 | Harada et al. |
| 3,824,104 A | 7/1974 | Kloczewski et al. |
| 4,003,877 A | 1/1977 | Lipson et al. |
| 4,376,815 A | 3/1983 | Oddi et al. |
| 4,931,507 A | 6/1990 | Sugawara et al. |
| 5,181,984 A | 1/1993 | Matsumura et al. |
| 5,667,934 A | 9/1997 | Markovich et al. |
| 5,805,427 A | 9/1998 | Hoffman |
| 6,074,896 A | 6/2000 | Dando |
| 6,114,187 A | 9/2000 | Hayes |
| 6,121,689 A | 9/2000 | Capote et al. |
| 6,180,696 B1 | 1/2001 | Wong et al. |
| 6,194,482 B1 | 2/2001 | Lehner et al. |
| 6,194,788 B1 | 2/2001 | Gilleo et al. |
| 6,207,475 B1 | 3/2001 | Lin et al. |
| 6,210,862 B1 | 4/2001 | Day et al. |
| 6,228,678 B1 | 5/2001 | Gilleo et al. |
| 6,245,595 B1 | 6/2001 | Nguyen et al. |
| 6,297,560 B1 | 10/2001 | Capote et al. |
| 6,376,158 B1 | 4/2002 | Jones et al. |
| 6,376,923 B1 | 4/2002 | Sumita et al. |
| 6,391,523 B1 | 5/2002 | Hurditch et al. |
| 6,437,052 B1 | 8/2002 | Iwasa et al. |
| 6,468,832 B1 | 10/2002 | Mostafazadeh |
| 6,506,681 B2 | 1/2003 | Grigg et al. |
| 6,509,208 B1 | 1/2003 | Brintzinger |
| 6,518,093 B1 | 2/2003 | Nakamikawa |
| 6,537,482 B1 | 3/2003 | Farnworth |
| 6,551,863 B2 | 4/2003 | Johnson et al. |
| 6,582,990 B2 | 6/2003 | Standing |
| 6,674,158 B2 | 1/2004 | Blalock |

(Continued)

FOREIGN PATENT DOCUMENTS

| | | |
|---|---|---|
| JP | 2001-057374 | 2/2001 |
| JP | 2001-3131 | 9/2001 |
| JP | 2002-201246 | 7/2002 |
| JP | 2004-87852 | 3/2004 |
| TW | 411514 | 11/2000 |
| WO | 99/56312 | 11/1999 |
| WO | 01/18887 | 3/2001 |
| WO | 01/20676 | 3/2001 |

OTHER PUBLICATIONS

Yangyang Sun, et al, Photo-Definable Nanoncomposite for Wafer Leverl Packaging, 2005 Electronic Components and Technology Conference, 2005, 179-184.

(Continued)

*Primary Examiner* — Caleen Sullivan
(74) *Attorney, Agent, or Firm* — Todd W. Galinski

(57) ABSTRACT

In a first aspect of the present invention, a method for manufacturing a flip chip package is provided comprising the steps of a) providing a chip having electrically conductive pads on an active surface thereof, b) coating at least a portion the chip with a protectant composition comprising a polymerizable component comprising a thermosetting epoxy resin, at least 50 weight percent of a substantially transparent filler having a coefficient of thermal expansion of less than 10 ppm/° C., a photoinitator, and a solvent carrier, wherein the protectant composition comprises a thixotropic index of less than 1.5, c) masking the coated chip to mask areas where vias through the protectant are desired, d) exposing the masked chip to a light source sufficient to partially crosslink the protectant composition in the unmasked areas, e) removing the uncured portions of the protectant composition thereby creating vias through the protectant composition to the electrically conductive pads on the surface of the chip, f) applying an electrically conductive material to the chip through the vias, wherein the electrically conductive material protrudes from the surface of the protectant composition, and g) heating the chip to a temperature sufficient to reflow the electrically conductive material and thermoset the protectant composition.

17 Claims, No Drawings

(56) References Cited

U.S. PATENT DOCUMENTS

| | | |
|---|---|---|
| 6,692,986 B1 | 2/2004 | Bayer et al. |
| 6,732,913 B2 | 5/2004 | Alvarez |
| 6,746,896 B1 | 6/2004 | Shi et al. |
| 6,750,135 B2 | 6/2004 | Elenius et al. |
| 6,774,493 B2 | 8/2004 | Capote et al. |
| 6,784,020 B2 | 8/2004 | Lee et al. |
| 6,833,627 B2 | 12/2004 | Farnworth |
| 6,833,629 B2 | 12/2004 | Ma et al. |
| 6,918,984 B2 | 7/2005 | Murray et al. |
| 6,924,171 B2 | 8/2005 | Buchwalter et al. |
| 6,984,545 B2 | 1/2006 | Grigg et al. |
| 6,992,398 B2 | 1/2006 | Farnworth |
| 7,011,989 B2 | 3/2006 | Becker et al. |
| 7,015,069 B2 | 3/2006 | Takahashi et al. |
| 7,037,399 B2 | 5/2006 | Tong et al. |
| 7,057,294 B2 | 6/2006 | Shibata |
| 7,063,934 B2 | 6/2006 | Saito et al. |
| 7,071,012 B2 | 7/2006 | Tan et al. |
| 7,097,958 B2 | 8/2006 | Sugano et al. |
| 7,150,390 B2 | 12/2006 | Johnson et al. |
| 7,238,602 B2 | 7/2007 | Yang |
| 7,279,362 B2 | 10/2007 | Li et al. |
| 7,282,375 B1 | 10/2007 | Kelkar |
| 7,314,778 B2 | 1/2008 | Jayaraman et al. |
| 7,329,598 B2 | 2/2008 | Shizuno |
| 7,335,986 B1 | 2/2008 | Paek et al. |
| 7,338,842 B2 | 3/2008 | Chaware et al. |
| 7,339,272 B2 | 3/2008 | Chen et al. |
| 2001/0028108 A1 | 10/2001 | Higashi et al. |
| 2002/0022310 A1 | 2/2002 | Han et al. |
| 2002/0043711 A1 | 4/2002 | Akram et al. |
| 2003/0114556 A1 | 6/2003 | Jennrich et al. |
| 2003/0138733 A1 | 7/2003 | Sachdev et al. |
| 2003/0170921 A1 | 9/2003 | Akram |
| 2004/0005770 A1 | 1/2004 | Farnworth et al. |
| 2004/0032020 A1 | 2/2004 | Akram |
| 2004/0113243 A1 | 6/2004 | Blalock |
| 2004/0122122 A1 | 6/2004 | Palazzotto et al. |
| 2006/0125119 A1 | 6/2006 | Xiao et al. |
| 2006/0147719 A1 | 7/2006 | Rubinsztajn et al. |
| 2006/0292887 A1 | 12/2006 | Hara |
| 2007/0082203 A1 | 4/2007 | Canelas et al. |
| 2007/0164431 A1 | 7/2007 | Lee et al. |
| 2007/0284758 A1 | 12/2007 | Zhang et al. |
| 2008/0169539 A1 | 7/2008 | Fang et al. |

OTHER PUBLICATIONS

Franck Dosseul, et al., WLCSP: Challengers, Performances and Trends: Key Parameters Influencing the Board Level Reliability of WLCSP: Challenges, Performances and Trends: Key Parameters Influencing the Board Level Reliability of WLCSP, 7 pages.

Yangyang Sun, et al., A Novel Nanocomposite with Photo-Polymerization for Wafer Level Application, IEEE Transactions on Components and Packaging Technologies, vol. 31, No. 1, Mar. 2008, 8 pages.

R. Peddi, et al., Front Side Protection Layer for Improved Reliability of Wafer-Level Packages, 2009 Electronic Components and Technology Conference, 4 pages.

METHODS FOR PROTECTING A DIE SURFACE WITH PHOTOCURABLE MATERIALS

CROSS-REFERENCE TO RELATED APPLICATIONS

This patent application is a divisional application of co-pending U.S. application Ser. No. 13/130,775, filed May 24, 2011, which is a 371 application of PCT/US09/65887, filed Nov. 25, 2009, which claims priority to US Provisional Application Nos. 61/174,147 filed on Apr. 30, 2009 and 61/117,707 filed on Nov. 25, 2008, all of which are incorporated herein by reference in their entireties.

FIELD OF THE INVENTION

The present invention is directed to microelectronic chip assemblies and in particular, methods and materials for applying a photocurable protectant composition to integrated circuit wafers.

BACKGROUND OF THE INVENTION

Surface mounting of electronic components is well developed in automated package assembly systems. Integrated circuits are made up of devices such as transistors and diodes and elements such as resistors and capacitors linked together by conductive connections to form one or more functional circuits. The devices are built on wafers, or sheets of silicon with a surface that is subject to a series of fabrication steps to form a pattern of identical integrated circuits separated from each other by a repeating rectangular pattern of scribe lines or saw streets in the surface of the wafer that serve as boundaries between the chip or die. At a late stage in a fabrication process the singulated die from the wafer is bonded to a substrate to form an IC package.

Conventional flip chip technology generally refers to any assembly where the active side of the integrated circuit die is attached to a package substrate or printed circuit board (collectively referred to as a PCB). In connection with the use of flip chips, the chip is provided with bumps or balls of solder (hereafter "bumps" or "solder bumps") positioned in locations on the active side designed to correspond to the interconnect areas or pads on the surface of the circuit board. The chip is mounted by registering the bumps with the board such that the solder bumps become sandwiched between the pads on the board and the chip. Heat is applied to the assembly to a point at which the solder is caused to melt, flow, and contact fully the pads on the board (referred to as reflow). Upon cooling, the solder hardens, thereby mounting the flip chip to the board's surface. Conventional underfill materials are used in several distinct approaches and are applied to a mounted chip to provide protection of the chip against chemical attack, moisture, radiation, air-borne contaminants, and the like, as well as against mechanical shock, vibration, and temperature cycling encountered in transit as well as use. A conventional capillary flip chip underfill process entails the steps of alignment of chip and circuit board, flux dispensing, solder reflow, flux cleaning, underfill application, underfill flow and curing.

Underfill materials used in chip packages serve functions to protect the solder joints that interconnect the chip and package or board from environmental factors such as moisture and contaminants and to redistribute mechanical stresses, which in turn increases device lifetime. Protection is provided for the chip against contaminants such as moisture and resulting corrosion of the metal interconnects. However improper selection of adhesives can result in flip chip package failures in several modes, such as shrinkage, delamination, hydrolytic instability, corrosion, and contamination by the underfill.

Chip underfill materials are designed to avoid imparting stress between the adherends as a result of differential coefficients of thermal expansion between the chip, interconnects, underfill and substrate. Failure modes due to stresses become more prevalent if the substrate is organic and as device size increases. A chip underfill must provide the function of adhering to the substrate, which may or may not be coated with solder mask; metal alloy or organic interconnects; and the integrated circuit die (chip), typically comprised of silicon or other inorganic species and may or may not be coated with an organic passivation layer.

In one of two principle ways to package electronic components, the components are soldered to the same side of the board upon which they are mounted. These devices are said to be "surface-mounted". Two types of conventional underfill materials are in practice for use with surface-mounted devices: capillary flow and "no flow" types. Detailed descriptions of these technologies can be found in the literature. For example, see John H. Lau's book Low Cost Flip Chip Technologies for DCA, WLCSP and PBGA Assemblies, McGraw-Hill, 2000. For both of these technologies, heat is typically used to either cure a liquid thermosetting formulation or laminate a solid film into the assembly. Vacuum is sometimes used to remove air voids from the system. The underfill is typically applied on the surface mount (SMT) assembly line for chip in-package or chip on-board. The use of the traditional flow and no-flow underfills requires several steps on the SMT line, and this process is usually the bottleneck on these microelectronics assembly lines.

Flip chip type electronic packages suffer from sensitivities to impact and thermal stresses. These components typically fail at the electrical interconnects (such as solder bumps), or the dielectric layers on the silicon. An underfill is typically employed to secure the solder joints and protect the silicon die from exposure to extreme stress and/or corrosive environments.

Uncured liquid underfills are typically dispensed after the electrical interconnections are made, and cured to provide a mechanical bond between the die and board. The underfills also mechanically brace the solder and die, transferring stress away from the areas most prone to failure.

Another type of underfill is the wafer applied solder brace coating, which like an underfill, braces the solder and reinforces the die. But unlike liquid dispensed underfills, the wafer applied solder braces do not form a bond between the die and board. Wafer applied solder braces also are applied prior to bonding of the die to the board, typically at the wafer level (prior to dicing).

There are several methods of coating a wafer level solder bracing material. One method is to coat the wafer uniformly with the bracing material, then pattern holes into the coating by laser drilling or UV exposure. The subsequent holes are then filled with solder to make the electrical interconnect. This method has difficulties with alignment; the opaque coating material covers the entire surface of the wafer, and alignment of the drilling or UV exposure tools is made difficult. Further issues are related to cleaning the residue in the patterned holes for efficient soldering.

Additionally, passivation films and other semiconductor die coatings are commonly used as a barrier to physical damage and environmental contaminants. In the manufacture of semiconductor devices, the entire top surface of the wafer is often coated with a passivation film following the formation of the final metal layer. The passivation film is an insulating protective layer that minimizes damage to the dies during assembly and packaging. Passivation film may comprise inorganic compounds such as phosphosilicate glass and silicon nitride or organic compounds such as polyimides. The polyimide film is spun on to the wafer as a liquid polyamic-acid precursor. During high temperature curing or with the aid of a photoinitiator, the polyamic acid undergoes a chemical change called imidization that causes it to become the solid polyimide film.

Further, dielectric layers are provided to isolate the various electrical components on the die and provide an electrically insulating function. Vias are created through the dielectric layer to enable electrical interconnects to be established through the various layers of the chip package through standard photo-resist processing.

SUMMARY OF THE INVENTION

In a first aspect of the present invention, a method for manufacturing a flip chip package is provided comprising the steps of a) providing a chip having electrically conductive pads on an active surface thereof, b) coating at least a portion the chip with a protectant composition comprising a polymerizable component comprising a thermosetting epoxy resin, at least 50 weight percent of a substantially transparent filler having a coefficient of thermal expansion of less than 10 ppm/° C., a photoinitator, and a solvent carrier, wherein the protectant composition comprises a thixotropic index of less than 1.5, c) masking the coated chip to mask areas where vias through the protectant are desired, d) exposing the masked chip to a light source sufficient to partially crosslink the protectant composition in the unmasked areas, e) removing the uncured portions of the protectant composition thereby creating vias through the protectant composition to the electrically conductive pads on the surface of the chip, f) applying an electrically conductive material to the chip through the vias, wherein the electrically conductive material protrudes from the surface of the protectant composition, and g) heating the chip to a temperature sufficient to reflow the electrically conductive material and thermoset the protectant composition.

In another aspect of the present invention, the method further includes a temporary substrate on which the chip is positioned. In this method the chip is provided on a temporary substrate which is larger in area than the chip; during step b) at least a portion of the temporary substrate adjacent to the chip is coated with the protectant composition; during steps c) and d) the coated portions of the temporary substrate are masked and exposed, and in step e) any uncured portions of the protectant on the temporary substrate are removed to provide vias through the protectant coating to the temporary substrate. In a further embodiment of this aspect of the present invention, an additional step of applying an electrically conductive material to the vias of the chip and the vias of the temporary substrate is added. In still another embodiment of the present invention, the electrically conductive material applied to the vias of the chip comprises solder and the electrically conductive material applied to the vias of the temporary substrate comprises an electrically conductive paste.

In a further embodiment of the present invention, the electrically conductive material comprises solder balls. In an additional embodiment of the present invention, the substantially transparent filler comprises a coefficient of thermal expansion of less than 2 ppm/° C. In a further embodiment of the present invention, during step g) the temperature is at least 120° C. And in yet another embodiment of the present invention, a flux composition is applied in the vias prior to step f).

And in a yet further embodiment of the present invention, step e) comprises exposing the chip to a development solution by an impinging spray.

In another embodiment of the present invention, step b) is accomplished through at least one of spin coating, screen printing, or stencil printing. In a further embodiment of the present invention, the chip is provided as a plurality of chips comprising a wafer. In a further embodiment of the present invention, the method further comprises the step of dicing the wafer to create individual dies. In another embodiment of the present invention, during the step of dicing the wafer is aligned through visual means through the protectant composition.

In one embodiment of the present invention, the coefficient of thermal expansion of the thermoset protectant composition is less than 20 ppm/° C. In another embodiment of the present invention, prior to step c) the material is b-staged to form a solid composition by removing the solvent. In a further embodiment of the present invention, the b-staging is accomplished by heating the coated chip to a temperature not exceeding 120° C.

In an additional embodiment of the present invention, the substantially transparent filler comprises fused silica. In a preferred embodiment of the present invention, the filler comprises an average particle size of greater than 0.40 microns. In a most preferred embodiment of the present invention, less than 5 weight percent of the filler particles have a particle size of less than 0.10 microns.

In yet another embodiment of the present invention, the polymerizable component of the protectant composition comprises at least 98 percent of an epoxy-based material. In a further embodiment of the present invention, the polymerizable component of the protectant composition consists essentially of an epoxy-based material.

In a preferred embodiment of the present invention, the filler has a refractive index, and the epoxy is selected to have a refractive index of within 10 percent of the refractive index of the filler. In another embodiment of the present invention, the filler is present in an amount from 50 weight percent to about 90 weight percent based on the total weight of the protectant composition. In a more preferred embodiment of the present invention, the filler is present in an amount from 65 weight percent to about 75 weight percent based on the total weight of the protectant composition. In a most preferred embodiment of the present invention, the filler is present at about 70 weight percent based on the total weight of the protectant composition.

In another embodiment of the present invention, the epoxy resin is present in an amount from 10 weight percent to 50 weight percent based on the total weight of the protectant composition. In a further embodiment of the present invention, the epoxy resin is present in an amount from 25 weight percent to 35 weight percent based on the total weight of the protectant composition. In a still further embodiment of the present invention, the epoxy resin is present at about 10 weight percent based on the total weight of the protectant composition.

In one embodiment of the present invention, the solvent is present at about 15 weight percent based on the total weight of the protectant composition. And in another embodiment of the present invention, the photoinitiator is present in an amount from 0.1 to 2.5 weight percent based on the total weight of the protectant composition.

In a preferred embodiment of the present invention, the protectant composition is substantially absent polyimides or polyimide precursors, and in a most preferred embodiment of the present invention, the protectant composition is completely free from polyimides or polyimide precursors. Additionally, in another preferred embodiment of the present invention, the protectant composition is substantially absent acrylates.

Thus, there has been outlined, rather broadly, the more important features of the invention in order that the detailed description that follows may be better understood and in order that the present contribution to the art may be better appreciated. There are, obviously, additional features of the invention that will be described hereinafter and which will form the subject matter of the claims appended hereto. In this respect, before explaining several embodiments of the invention in detail, it is to be understood that the invention is not limited in its application to the details and construction and to the arrangement of the components set forth in the following description. The invention is capable of other embodiments and of being practiced and carried out in various ways.

It is also to be understood that the phraseology and terminology herein are for the purposes of description and should not be regarded as limiting in any respect. Those skilled in the art will appreciate the concepts upon which this disclosure is based and that it may readily be utilized as the basis for designating other structures, methods and systems for carrying out the several purposes of this development. It is important that the claims be regarded as including such equivalent constructions insofar as they do not depart from the spirit and scope of the present invention.

DETAILED DESCRIPTION OF THE INVENTION

In a first aspect of the present invention, a photo-curable epoxy microelectronics protectant composition is provided which can be applied to the surface of a wafer as a stress buffer and electrically isolative material. The single material can take the place of multiple dielectrics, such as such as photo-definable polyimides, molding compounds, part-underfills.

In one embodiment of the present invention, the protectant composition comprises a photocurable epoxy resin, a filler that is substantially transparent, a solvent carrier and a photoinitiator, wherein the protectant composition is substantially transparent.

The protectant composition materials employed in the present invention comprise those which are photo-definable as well as thermally curable. As such, the material can be at least partially hardened or gelled when exposed to UV or other photo-radiation, then are more fully cured or hardened when heated during the reflow process.

In one embodiment of the present invention, the protectant composition comprises an optically and UV transparent, or substantially transparent, material. It is desirable to have a degree of UV transparency so as to ensure adequate cure by the photoinitiator during the masking/via creating step, and optical transparency is desirable to aid in visual alignment for wafer dicing and mask alignments for UV exposure and solder ball drop. For the purposes of this invention, "substantially transparent" is meant to include a protectant material that will cure when exposed to photo-illumination and features on a substrate can be viewed through the material for identification and alignment purposes, at an applied material thickness of 50 µm.

Selection of the components of the protectant composition is driven by the need for transparency, as well as a desire to match the coefficient of thermal expansion of surrounding materials at normal operating temperatures. Epoxy resins generally have a coefficient of thermal expansion in the range of 50-80 ppm/° C., however the coefficient of thermal expansion of the silicon die is about 2.8 ppm/° C. As such, it is preferable to employ a filler which has a very low coefficient of thermal expansion so as to reduce the coefficient of thermal expansion of the protectant composition as much as possible or to match the coefficient of thermal expansion of the interconnect. In a preferred embodiment of the present invention, the protectant composition comprises a coefficient of thermal expansion of less than 20 ppm/° C. at or around room temperature.

In another preferred embodiment of the present invention, the protectant composition has a viscosity and thixotropic properties which allow for spin coating or printing of the material onto a wafer. The desirable thixotropic properties are best measured by the thixotropic index, wherein the thixotropic index is a ratio of viscosity at a shear rate of 1/s to the viscosity at a shear rate of 10/s at room temperature (about 20° C.). In a preferred embodiment of the present invention, the thixotropic index is less than 1.5, and in a most preferred embodiment of the present invention, the thixotropic index is less than 1.3.

The substantially transparent filler can be organic, inorganic or a mixture thereof. The fillers for use in the present invention comprise those which are UV and optically transparent so as not to interfere with the UV curatives and allow for alignment of masks for photo-definition of the protectant. Additionally, the fillers suitable for use in the present invention are thermally conductive, but not electrically conductive, i.e. low dielectric. Additionally, the preferred fillers of the present invention have a low coefficient of thermal expansion, preferably as close to zero or negative as possible. For this reason, fillers of crystalline structure are particularly preferred. In a most preferred embodiment of the present invention, the coefficient of thermal expansion of the filler is less than 10 ppm/° C., more preferably less than 5 ppm/° C., and most preferably less than 2 ppm/° C.

Most preferred fillers comprise those which are UV transparent such that if a film of 100 µm thickness is prepared by photocuring a photocurable composition containing 70 percent by weight of the filler and a broad band exposure wavelength of 500 nm to 200 nm UV light is irradiated onto the film, at least 40 percent of the light is transmitted through the film, relative to the amount of light transmitted through a control film of the same thickness containing no filler.

In one embodiment of the present invention, the filler comprises silicon dioxide. Silicon dioxide is preferred in applications where non-electrically conductive filler is desirable. In another embodiment of the present invention, suitable fillers include, diamond, quartz, silicon carbide, substantially transparent metal oxides, zirconium oxides, and the like.

In one embodiment of the present invention, the filler comprises an average particle size from about 0.40 microns to about 30 microns. In a more preferred embodiment of the present invention, the fuller comprises an average particles size of about 0.6 microns to 5.0 microns. In another embodiment of the present invention, it is preferred to avoid very small filler particles due to negative effects on thixotropy and as such, less than 5 weight percent of the filler particles should be less than 0.10 microns.

Preferably, the filler is present in an amount from 50 weight percent to about 90 weight percent based on the total weight of the protectant composition, and more preferably the filler is present in an amount from 65 weight percent to about 75 weight percent based on the total weight of the protectant composition. In a most preferred embodiment of the present invention, the filler is present at about 70 weight percent based on the total weight of the protectant composition.

Photocurable epoxies are well known polymeric materials characterized by the presence of oxirane functionality, and which are curable through a cationic induced polymerization mechanism. Suitable photocurable epoxies include cycloaliphatic epoxy monomers, oligomers, or combinations thereof.

In one embodiment of the present invention, the photocurable epoxy may comprise monofunctional and multifunctional glycidyl ethers of Bisphenol-A and Bisphenol-F, aliphatic and aromatic epoxies, saturated and unsaturated epoxies, cycloaliphatic epoxy resins and combinations of those. Another suitable epoxy resin is epoxy novolac resin, which is prepared by the reaction of phenolic resin and epichlorohydrin. A preferred epoxy novolac resin is poly (phenyl glycidyl ether)-co-formaldehyde. Other suitable epoxy resins are biphenyl epoxy resin, commonly prepared by the reaction of biphenyl resin and epichlorohydrin; dicyclopentadiene-phenol epoxy resin; naphthalene resins; epoxy functional butadiene acrylonitrile copolymers; epoxy functional polydimethyl siloxane; and mixtures of the above. Non-glycidyl ether epoxides may also be used. Suitable examples include 3,4-epoxycyclohexylmethyl-3,4-epoxycyclohexane carboxylate, which contains two epoxide groups that are part of the ring structures and an ester linkage; vinylcyclohexene dioxide, which contains two epoxide groups and one of which is part of the ring structure; 3,4-epoxy-6-methyl cyclohexyl methyl-3,4-epoxycyclohexane carboxylate; and dicyclopentadiene dioxide.

The epoxy component of the protectant composition is selected for solvent compatibility, melting/softening temperature, adhesion to substrates, cured modulus, cured CTE, and ionic residue. In most microelectronic applications, adhesion and ionic reside are the most important parameters. Further, the epoxy chosen or use in the present invention must be substantially transparent to UV and visible light.

In a preferred embodiment of the present invention, the epoxy resin is selected to have a refractive index when cured which matches the refractive index of the filler to allow greater transparency of the composition. In one preferred embodiment of the present invention, silica with a refractive index of about 1.46 is selected as the filler. In this embodiment, the refractive index of the resin is preferably between 1.4 to 1.7 and more preferably less than 1.5.

As such, in a preferred embodiment of the present invention, the refractive index of the epoxy and refractive index of the filler are chosen to be with in 10 percent of each other, and most preferably within 7 percent and even more preferably within 5 percent or less.

In one embodiment of the present invention, the epoxy resin is present in an amount from 10 to 50 weight percent, preferably 25 to 35 weight percent based on the total weight of the uncured material, and more preferably the epoxy resin is present at about 10 weight percent based on the total weight of the uncured material.

In an embodiment of the present invention, it is preferred not to have a significant quantity of other polymerizable components in the protectant composition other than the epoxy and photoinitiator components. As such, the polymerizable component of the protectant composition comprises at least 98 percent of an epoxy material. In a more preferred embodiment of the present invention, the protectant composition is substantially absent, or alternatively, completely free of polyimides or polyimide precursors. In another embodiment of the present invention, the protectant composition is substantially absent, or alternatively completely free, of acrylates.

In one embodiment of the present invention, the photoinitiator is chosen to partially crosslink the epoxy resin at a desired wavelength. When the protectant materials polymerizes under the influence of UV or other photo-radiation, the material is converted from a solid or stiff gel or paste at ambient temperatures to an at least partially crosslinked solid incapable of resolvation, preferably having a tack free surface. The at least partially crosslinked solid remains as a thermoplastic, meaning, it remains in a heat-liquefiable state until fully thermally cured.

These photoinitators release reactive cations when exposed to a particular wavelength of light. Generally, such photoinitators comprise organic onium salts, preferably containing sulfur or iodine as the central atom of the cation. In one embodiment of the present invention, the photoinitiator comprises at least one of diaryliodonium salts, triarylsulfonium salts, and mixtures thereof. One suitable photoinitator comprises triarylsulfonium hexafluorophosphate. Preferred photoinitiators comprise those with low residual ionics and are substantially absent toxicity issues.

In one embodiment of the present invention, the photoinitiator is present in an amount from 0.1 to 2.5 weight percent based on the total weight of the protectant composition. In a more preferred embodiment of the present invention, the photoinitiator is present in an amount from 0.5 to 1.5 weight percent based on the total weight of the protectant composition.

Any source of actinic light dose that does not raise the coating temperature above about 120° C. can be used in carrying out the photocuring solidification of the protectant composition to the solid liquefiable gel state. Ultraviolet light is most readily employed, as well as other forms, such as Type RS Sunlamps, carbon arc lamps, xenon arc lamps, mercury vapor lamps, tungsten halide lamps and the like. The radiation energy may emanate from a point source or in the form of parallel rays. Divergent beams, are however, also operable as a source of actinic light. A UV dosage in a range of 100 to 2400 mJ/cm$^2$ is effective to provide the necessary depth of cure. In a preferred embodiment of the present invention, the protectant composition photocures to a tack-free surface. Curing periods may be adjusted to proper choice of ultraviolet source, photocuring component concentration, and the like.

In an embodiment of the present invention, suitable solvents include those which are suitably volatile so as to evaporate at normal processing temperatures of about 100° C. to 250° C. Suitable solvents may include one or more organic solvents, such as 1-methoxy-2-propanol, methoxy propanol acetate, butyl acetate, methoxy-ethyl ether, methanol, ethanol, isopropanol, ethylene glycol, methyl-ethyl ketone, cyclo-hexanone, benzene, toluene, xylene, and cellosolves such as ethylcellosolve, ethyl acetate, cellosolve acetate, butyl cellosolve acetate, carbitol acetate, and butyl carbitol acetate, and combinations of thereof. In a preferred embodiment of the present invention, the solvent comprises the ketone-type solvents such as methyl isobutyl ketone (MIBK), acetone, and methyl ethyl ketone (MEK).

In a preferred embodiment of the present invention, after application of the protectant composition to a wafer or die, the solvent is extracted to form a semi-solid protectant composition, also known as "b-staging". In one embodiment of the present invention, substantially all of the solvent is removed during the b-staging however trace amounts may still remain in the protectant composition. Most importantly during this step is that the liquid or paste applied protectant composition is dried sufficiently to form a solid composition.

In one embodiment of the present invention, the solvent is present in an amount from 10 weight percent to 20 weight percent based on the total weight of the uncured material, and preferably in an amount of about 15 weight percent based on the total weight of the protectant composition.

In an additional embodiment of the present invention, other components such as secondary fillers, wetting agents, sensitizer, thixotropic agents, adhesion promoters, and other additives may optionally be present.

In a further aspect of the present invention, the curable material is substantially absent polyimides or polyimide precursors. In a still further aspect of the present invention, the curable material is completely free from polyimides or polyimide precursors.

The protectant compositions of the various embodiments of the present invention has particular utility in wafer-level chip fabrication. Additionally, the materials and methods of the present invention have utility in many flip chip manufacturing processes a few of which are preferred and will be outlined herein. The photo-curable material achieves these benefits by having low cure stress and having customizable mechanical properties, such as CTE, modulus, Tg, and adhesion.

Unlike traditional polyimides (PI), the protectant composition of the present invention may be applied as a thick coating, preferably between 20 μm and 200 μm and most preferably between 25 μm and 60 μm. Further, this material can take the place of the polyimide layer and and provide underfill properties as well. In one embodiment of the present invention, multiple layers can be used, with metal trace application between, which allows this material to be used as a redistribution layer. This technique makes the material particularly useful for embedding high density electronic traces into molding compounds or 3D packages.

When combined with known soldering techniques, this material can also take the place of stress buffer coatings, such as wafer applied underfills. Vias can be created for solder bumping on the surface, in the middle, or underneath the new coating material. These vias can be of any shape or size as desirable in a particular application.

The protectant composition can also be combined with existing dielectric technologies, such as polyimides to give symbiotic benefits. One example would be a Chip Scale Package (CSP) using a PI redistribution layer (RDL), coupled to the protectant composition as the final passivation layer. Thus, the protectant composition's main purpose is to protect the copper traces on the surface of the PI. If a solder bump site is created on the PI RDL surface, than the protectant composition can also fill a mechanical function, as an in-part underfill. The inverse laminate may also be preformed, where the PI is used as a protective layer for the metal traced protectant composition dielectric. A further design enabled by this material would be a multi-layer laminate which interfaces the solder interconnects at different points. One example would be where the solder interconnects with the non-PI defined die pads and the epoxy encapsulates the solder.

In a preferred embodiment of the present invention, a method for manufacturing a flip chip package is provided. First, a chip or die is provided having electrically conductive pads on an active surface thereof. Dies are built on wafers and as such, the die may be singulated and processed individually, or alternately, remain affixed to the wafer for wafer-level processing. In a preferred embodiment of the present invention, the methods are carried out at the wafer level, prior to singulation of the die. However, one skilled in the art will recognize that the materials and methods of the present invention may be employed at the wafer level, on an individual die, or on a plurality of die simultaneously.

In one embodiment of the present invention, the photocurable protectant composition is applied to the wafer by at least one of spin coating, printing, spraying, stencil applied, or adhesive film application techniques as are known in the art.

In a preferred embodiment of the present invention, the protectant composition is spin coated as a viscous liquid to coat wafer to a thickness of greater than 20 μm and preferably to a predetermined thickness which is less than that of the solder balls to be applied.

In another embodiment of the present invention, the protectant composition is screen or stencil printed onto the die so as to selectively apply the composition to predetermined portions of the die surface. For example, certain areas can be left free of the composition such as saw streets, alignment marks, electrical interconnect pads, areas pre-bumped, and edge exclusion zones. In this manner the amount of protectant composition applied to the die can be reduced as can the need for subsequent removal of unnecessary protectant composition.

In another embodiment of the present invention, the solvent is removed from the protectant composition to solidify the composition on the wafer. The solvent may be removed through air drying at ambient temperature, and/or under vacuum, however in a preferred embodiment of the present invention, the coated wafer is heated to drive off the solvent. Care must be taken not to heat the material so much so as to initiate thermal cure of the epoxy, however if the temperature is kept below 120° C., preferably below 100° C., excessive hardening of the epoxy can be avoided. After eradication of the solvent the formulation is said to be b-staged and can be stored for extended periods of time, if desired, before further processing.

In another embodiment of the present invention, the b-staged protectant material is masked to provide shadowing in areas where vias, or pathways, through the protectant are desired. The wafer is then exposed to a light source sufficient to partially crosslink the protectant composition in the unmasked areas through the action of the photoinitiator. Selection of the type and quantity of photoinitiator will tailor the cure profile as is suitable for a particular operation. The exposed portions of the protectant material are at least partially crosslinked, where the masked portions are left uncured and can be removed.

Removal of the uncured portions of the protectant material may be accomplished through several methods. In one embodiment of the present invention, the material is exposed to a development solution, or solvent wash, which is capable of washing the uncured material away thereby exposing the vias. The development solution may be sprayed on or, alternately, the wafer maybe immersed in the solution. In another embodiment of the present invention, ultrasonic vibration is employed to remove the uncured portions of the protectant composition. In a preferred embodiment of the present invention, the vias are created through the entire thickness of the protectant composition to expose the electrically conductive pads on the active surface of the chip.

Once vias are created, solder balls, or other electrically conductive material, are applied in the vias through methods which are known in the art. In a preferred embodiment of the present invention, a flux material is placed on the electrically conductive pads prior to the application of solder. The solder balls are then positioned in the vias, preferably such that at least a portion of the solder balls extends above the surface of the protectant composition. With the solder balls in place, the wafer is heated to a temperature sufficient to reflow the solder and complete the cure of the protectant composition.

In order to provide adequate reflow of the photo-cured solid, no advancement of the thermal cure system in the photo-cured solid coating on the wafer or dice takes place until the solder reflow step. In one embodiment of the present invention, a latent thermal accelerator as is know in the art may optionally be employed to regulate cure of epoxy. The thermal cure onset minimum temperature is predetermined by the selection of the epoxy component, and preferably occur after the onset of solder reflow, at a temperature greater than or equal to 120° C. Preferably, the minimum protectant composition thermal cure onset is in the range of 120° C. to 225° C. Temperatures of onset of thermal curing should not be more than about 280° C. The onset of thermal cure should not be too near the peak reflow temperature which is typically at or near 250° C. for eutectic solder and 300° C. for lead free solder. A typical solder reflow time takes 3 to 4 minutes, and the protectant composition is typically exposed to the peak temperature for less than 30 seconds. Thermal cure initiated at temperatures below 120° C. leads to inadequate protectant composition liquefaction and flow.

In another embodiment of the present invention, the wafer may be further processed to singulate the die/chips, which may then be mounted on a substrate. The protectant material is of particular utility in the dicing process because it is transparent. This allows for visual confirmation of proper alignment of the wafer/dies before the wafer is cut, thereby preventing cutting errors and possible damage to the die.

In an alternate aspect of the present invention, a method for manufacturing a flip chip package is provided comprising applying solder balls to a die, which may or may not be part of an uncut wafer, coating the die/wafer with a photocurable protectant composition, masking the coated wafer to expose the area where solder balls are not present, exposing the masked wafer to a UV light source to cure the protectant composition in the exposed areas, and developing the exposed coated wafer to remove any uncured portions of the coating and expose the solder balls.

The benefit of this process is that alignment of the mask is facilitated as the solder balls already protrude through the coating. Furthermore, once exposed, the amount of material cleaned is much less, and there is less chance for inhibiting residue.

EXAMPLES

In a first exemplary embodiment of the present invention, a photocurable protectant composition is provided comprising Formula 1.

Formula 1

| Component | Weight (g) |
|---|---|
| Epoxy Resin | 62.01 |
| Silica (25 μm max) | 188.3 |
| Wetting Agent | 1.21 |
| Triarylsulfonium hexafluoroantimonate* | 1.50 |
| Dibutylacetate (solvent) | 35.0 |
| Total | 288.02 g |

*(50% in glycol acetate)

The protectant composition of Formula 1 was b-staged to remove solvent, then exposed to UV radiation to photocure the material, followed by a bake cycle intended to mimic reflow oven conditions and complete the thermosetting process of the material. Physical characteristics were then measured as detailed on the table below:

| Property | Measurement |
|---|---|
| Tg | 95° C. |
| CTE (below Tg) | 13 ppm/° C. |
| CTE (above Tg) | 51 ppm/° C. |
| Modulus (−40° C.) | 16.6 Gpa |
| Modulus (100° C.) | 12.0 Gpa |
| Tensile modulus (25° C.) | 3.9 Gpa |
| Tensile strength | 23 Mpa |
| Elongation | 0.90 percent |
| Die Shear Adhesion | >1600 psi |

Although the present invention has been described with reference to particular embodiments, it should be recognized that these embodiments are merely illustrative of the principles of the present invention. Those of ordinary skill in the art will appreciate that the compositions, apparatus and methods of the present invention may be constructed and implemented in other ways and embodiments. Accordingly, the description herein should not be read as limiting the present invention, as other embodiments also fall within the scope of the present invention as defined by the appended claims.

What is claimed is:

1. A method for manufacturing a flip chip package comprising:
    a) providing a chip having electrically conductive pads on an active surface thereof;
    b) coating at least a portion the chip with a protectant composition comprising a thermosetting epoxy resin, at least 50 weight percent of a substantially transparent filler comprising fused silica having an average particle size of about 0.40 microns to about 30 microns and a coefficient of thermal expansion of less than 10 ppm/° C., a photoinitator, and a solvent carrier, wherein the protectant composition comprises a thixotropic index of less than 1.5;
    c) removing the solvent to b-stage the protectant composition;
    d) optionally removing portions of the protectant composition thereby creating vias through the protectant composition to the electrically conductive pads on the surface of the chip and
    applying an electrically conductive material to the chip through the vias, wherein the electrically conductive material protrudes from the surface of the protectant composition;
    e) heating the chip to a temperature sufficient to thermoset the protectant composition;
    f) optionally removing portions of the protectant composition thereby creating vias through the protectant composition to the electrically conductive pads on the surface of the chip and applying an electrically conductive material to the chip through the vias, wherein the electrically conductive material protrudes from the surface of the protectant composition; and
    wherein at least one of steps d) and f) is practiced, and performed by laser drilling.

2. The method of claim 1, wherein the electrically conductive material comprises solder.

3. The method of claim 1, wherein the substantially transparent filler comprises a coefficient of thermal expansion of less than 2 ppm/° C.

4. The method of claim 1, wherein less than 5 weight percent of the filler comprises a particle size of less than 0.10 microns.

5. The method of claim 1, wherein during step f) the temperature is at least 120° C.

6. The method of claim 1, wherein a flux composition is applied in the vias prior to step e).

7. The method of claim 1, wherein step b) is accomplished through at least one of spin coating, screen printing, or stencil printing.

8. The method of claim 1, wherein the chip is provided as a plurality of chips comprising a wafer.

9. The method of claim 8, further comprising the step of dicing the wafer to create individual dies.

10. The method of claim 9, wherein during the step of dicing the wafer is aligned through visual means through the protectant composition.

11. The method of claim 1, wherein the coefficient of thermal expansion of the thermoset protectant composition is less than 20 ppm/° C.

12. The method of claim 1, wherein the b-staging is accomplished by heating the coated chip to a temperature not exceeding 120° C.

13. The method of claim 1, wherein the polymerizable component of the protectant composition comprises at least 98 percent of an epoxy-based material.

14. The method of claim 1, wherein the filler has a refractive index, and the epoxy is selected to have a refractive index of within 10 percent of the refractive index of the filler.

15. The method of claim 1, wherein the filler is present in an amount from 50 weight percent to about 90 weight percent based on the total weight of the protectant composition.

16. The method of claim 1, wherein the epoxy resin is present in an amount from 10 weight percent to 50 weight percent based on the total weight of the protectant composition.

17. The method of claim 1, wherein the photoinitiator is present in an amount from 0.1 to 2.5 weight percent based on the total weight of the protectant composition.

* * * * *